US009496292B2

(12) United States Patent
Miyake et al.

(10) Patent No.: US 9,496,292 B2
(45) Date of Patent: Nov. 15, 2016

(54) DISPLAY DEVICE AND MANUFACTURING METHOD FOR SAME

(71) Applicant: Japan Display Inc., Minato-ku, Tokyo (JP)

(72) Inventors: Hidekazu Miyake, Mobara (JP); Norihiro Uemura, Mobara (JP); Takeshi Noda, Mobara (JP); Isao Suzumura, Tokyo (JP); Toshiki Kaneko, Chiba (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 13/915,671

(22) Filed: Jun. 12, 2013

(65) Prior Publication Data

US 2013/0334524 A1 Dec. 19, 2013

(30) Foreign Application Priority Data

Jun. 14, 2012 (JP) ................... 2012-134740

(51) Int. Cl.
*H01L 27/12* (2006.01)
*H01L 27/32* (2006.01)

(52) U.S. Cl.
CPC ....... *H01L 27/1244* (2013.01); *H01L 27/1225* (2013.01); *H01L 27/1288* (2013.01); *H01L 27/3244* (2013.01)

(58) Field of Classification Search
CPC . H01L 27/12; H01L 27/124; H01L 27/1255; H01L 27/1225; H01L 27/3262; H01L 27/3265; H01L 29/66757; H01L 29/78675; H01L 29/4908; G02F 1/136213; G02F 1/136227
USPC ........ 257/43, 59; 349/38, 39, 46, 47; 345/92
See application file for complete search history.

(56) References Cited

U.S. PATENT DOCUMENTS 5,474,941 A * 12/1995 Mitani et al. ................. 438/151
2003/0013247 A1* 1/2003 Tokuhiro et al. ............. 438/200
(Continued)

FOREIGN PATENT DOCUMENTS

CN 101097927 A 1/2008
CN 101165579 A 4/2008
(Continued)

OTHER PUBLICATIONS

Office Action in KR 10-2013-68007, mailed Jun. 25, 2014; (in Korean, 8 pgs.); [English language translation, 8 pgs.].
(Continued)

*Primary Examiner* — Jessica Stultz
*Assistant Examiner* — Mohammed R Alam
(74) *Attorney, Agent, or Firm* — Typha IP LLC (57) ABSTRACT

The present invention provides a display device having: gate electrodes formed on a transparent substrate; a gate insulating film for covering the gate electrodes; an oxide semiconductor formed on the gate insulating film; drain electrodes and source electrodes formed at a distance from each other with channel regions of the oxide semiconductor in between; an interlayer capacitor film for covering the drain electrodes and source electrodes; common electrodes formed on top of the interlayer capacitor film; and pixel electrodes formed so as to face the common electrodes, and wherein an etching stopper layer for covering the channel regions is formed between the oxide semiconductor and the drain electrodes and source electrodes, the drain electrodes are a multilayer film where a transparent conductive film and a metal film are layered on top of each other, and the drain electrodes and source electrodes make direct contact with the oxide semiconductor.

7 Claims, 10 Drawing Sheets

(56) References Cited

U.S. PATENT DOCUMENTS

| | | |
|---|---|---|
| 2005/0095874 A1* | 5/2005 | Park et al. .................... 438/800 |
| 2007/0295967 A1 | 12/2007 | Harada et al. |
| 2008/0087886 A1 | 4/2008 | Yang |
| 2009/0101895 A1 | 4/2009 | Kawamura et al. |
| 2010/0032664 A1* | 2/2010 | Lee et al. ......................... 257/43 |
| 2010/0207119 A1 | 8/2010 | Sakata et al. |
| 2010/0224870 A1* | 9/2010 | Iwasaki et al. ................. 257/43 |
| 2010/0244034 A1* | 9/2010 | Miyairi ........................... 257/59 |
| 2010/0289977 A1 | 11/2010 | Liu |
| 2011/0175096 A1 | 7/2011 | Gotoh et al. |
| 2012/0097940 A1* | 4/2012 | Kwon et al. .................... 257/43 |

FOREIGN PATENT DOCUMENTS

| | | |
|---|---|---|
| EP | 0519692 A2 | 12/1992 |
| JP | H01265233 A | 10/1989 |
| JP | H04-369229 A | 12/1992 |
| JP | H08262492 A | 10/1996 |
| JP | H10-209458 A | 8/1998 |
| JP | 2006100760 A | 4/2006 |
| JP | 2007096055 A | 4/2007 |
| JP | 2007-133371 A | 5/2007 |
| JP | 2007-157916 A | 6/2007 |
| JP | 2008-10440 | 1/2008 |
| JP | 2009-99887 | 5/2009 |
| JP | 2010-212673 A | 9/2010 |
| JP | 2011044697 A | 3/2011 |
| JP | 2011-145530 A | 7/2011 |
| JP | 2011192971 A | 9/2011 |
| KR | 10-2011-0027472 | 3/2011 |

OTHER PUBLICATIONS

Office Action dated on Mar. 2, 2015 regarding a counterpart Korean patent application No. 10-2013-0068007.

Office Action dated Jun. 3, 2015 regarding a corresponding Chinese Patent Application No. 201310237104.X.

Office Action dated Sep. 24, 2015 regarding a corresponding Japanese Patent Application No. 2012134740.

* cited by examiner

DISPLAY DEVICE AND MANUFACTURING METHOD FOR SAME

CROSS-REFERENCE TO RELATED APPLICATION

The present application claims priority over Japanese Patent Application JP2012-134740 filed on Jun. 14, 2012, the contents of which are hereby incorporated into this application by reference.

BACKGROUND OF THE INVENTION (1) Field of the Invention

The present invention relates to a display device and a manufacturing method for the same, and in particular, to a display device where an oxide semiconductor is used in the TFT circuit and a manufacturing method for the same.

(2) Description of the Related Art

Various types of display devices, such as a liquid crystal module (liquid crystal display device) and an organic electroluminescent display device, are used as the display device for many portable type information apparatuses, such as a cellular phone, a portable information terminal (PDA), a digital camera and a multimedia player.

An insulating substrate made of glass or a resin is used as a part of the display panel of these display devices, and thin film transistors (TFTs) are formed on the surface of this insulating substrate so as to be used as switching elements for driving the respective pixel electrodes.

The TFTs on the insulating substrate, for example, a glass substrate, data lines for transmitting signals for driving the TFTs, and gate lines for transmitting signals to pixel electrodes through the TFTs are formed on the insulating substrate in a predetermined microscopic pattern through selective etching in accordance with a photolithographic technology using a resist film, such as of a photoresist.

It has been desired to reduce the number of multilayer films and to reduce the number of steps in the selective etching in accordance with the photolithographic technology in order to make the display devices having the above-described structure flexible in order to reduce the cost. Furthermore, it is simultaneously required to increase the aperture ratio of the pixels, which is one important displaying function of the display device.

In recent years, a technology for using an oxide semiconductor layer as the semiconductor layer for forming the channel portion of the TFTs so that the data lines and the pixel electrodes made of a conductive film are directly connected to the oxide semiconductor layer has been used in order to address the above-described desire and request.

Concerning the above-described technology, in JP 2009-99887A, gate lines and a gate insulating film are formed on a substrate, and on top of this, data lines, pixel electrodes and an oxide semiconductor layer are formed so that the oxide semiconductor layer is directly connected to the pixel electrodes and the data lines, which are formed of different conductive films.

In the structure in JP 2009-99887A, however, an oxide semiconductor layer is formed so as to cover the data lines, and therefore, the oxide semiconductor layer can be easily disconnected in the portions where the steps of the data lines make contact with the oxide semiconductor layer. In addition, the pixel electrodes and the oxide semiconductor layer are structurally processed after the formation of the data lines, and therefore, the data lines may be dissolved or corroded by the etchant when the pixel electrodes and the oxide semiconductor layer are formed through etching, and as a result, the possibility of a data line being disconnected and the display performance of the display device significantly lowering increases.

SUMMARY OF THE INVENTION

An object of the present invention is to solve the above-described problems and to provide a display device using an oxide semiconductor layer where the number of multilayer films and the number of steps in the etching can be reduced at the time of the manufacture of the display device, and in addition, the aperture ratio of the pixels can be increased, as well as to provide a manufacturing method for the same.

In order to achieve the above-described objects, the present invention has the following technical features.

(1) A display device having: gate electrodes formed on a transparent substrate; a gate insulating film for covering the above-described gate electrodes; an oxide semiconductor formed on the above-described gate insulating film; drain electrodes and source electrodes formed at a distance from each other with channel regions in the above-described oxide semiconductor in between; an interlayer capacitor film for covering the above-described drain electrodes and source electrodes; common electrodes formed on top of the above-described interlayer capacitor film; and pixel electrodes formed so as to face the above-described common electrodes and connected to the above-described source electrodes, in which an etching stopper layer for covering the above-described channel regions is formed between the above-described oxide semiconductor and the above-described drain electrodes and source electrodes, the above-described drain electrodes are a multilayer film where a transparent conductive film and a metal film are layered on top of each other, and the above-described drain electrodes and source electrodes make direct contact with the above-described oxide semiconductor.

(2) In the display device according to the above (1), the entirety of the oxide semiconductor overlaps the above-described gate electrodes as viewed from the top, and the above-described source electrodes and the above-described pixel electrodes are integrally formed of the same transparent conductive film.

(3) In the display device according to the above (1), the source electrodes are a multilayer film where a transparent conductive film and a metal film are layered on top of each other, the above-described pixel electrodes are formed of the above-described metal film for forming the above-described source electrodes, and the above-described source electrodes and the above-described pixel electrodes are continuously formed.

(4) A display device having: gate electrodes formed on a transparent substrate; a gate insulating film for covering the above-described gate electrodes; an oxide semiconductor formed on the above-described gate insulating film; drain electrodes and source electrodes formed at a distance from each other with channel regions in the above-described oxide semiconductor in between; a protective insulating film for covering the above-described drain electrodes and source electrodes; lower electrodes connected to the above-described source electrodes; organic EL elements formed on top of the above-described lower electrodes; and upper electrodes formed so as to cover the above-described organic EL elements, in which an etching stopper layer for covering the above-described channel regions is formed between the above-described oxide semiconductor and the above-described drain electrodes and source electrodes, the above-described drain electrodes are a multilayer film where a transparent conductive film and a metal film are layered on top of each other, and the above-described drain electrodes and source electrodes make direct contact with the above-described oxide semiconductor.

(5) In the display device according to the above (4), the source electrodes are a multilayer film where a transparent conductive film and a metal film are layered on top of each other, the above-described lower electrodes are formed of the above-described metal film for forming the above-described source electrodes, the above-described source electrodes and the above-described lower electrodes are continuously formed, and the above-described upper electrodes are formed of a transparent conductive film.

(6) In the display device according to the above (4), the source electrodes and the above-described lower electrodes are integrally formed of the same transparent conductive film, and the above-described upper electrodes are formed of a metal film.

(7) In the display device according to any of the above (1) to (6), the thickness of the above-described transparent conductive film for forming the above-described source electrodes and drain electrodes is 10 nm or greater and 100 nm or less.

(8) In the display device according to any of the above (1) to (7), the etching stopper layer is tapered in the vertical direction in a cross-section at an angle of 10 degrees or greater and 75 degrees or less.

(9) In the display device according to any of the above (1) to (8), the height of the above-described etching stopping layer is 50 nm or greater and 500 nm or less.

(10) In the display device according to any of the above (1) to (9), the oxide semiconductor includes at least one of ZnO, InGaZnO, ZnInO and ZnSnO.

(11) In the display device according to any of the above (1) to (10), the transparent conductive film is formed of either indium tin oxide or indium zinc oxide.

(12) In the display device according to any of the above (1) to (11), the metal film includes one of Mo, Cr, W, Al, Cu, Ti, Ni, Ta and Ag.

(13) A manufacturing method for a display device, comprising the steps of: forming gate electrodes on a substrate; forming a gate insulating film so as to cover the above-described gate electrodes; forming an oxide semiconductor on the above-described gate insulating film; forming an etching stopper layer so as to cover channel regions in the above-described oxide semiconductor; forming drain electrodes, source electrodes and pixel electrodes, which are at a distance from each other above the above-described etching stopper layer, of a transparent conductive film that has been formed so as to make direct contact with the above-described oxide semiconductor; further forming a metal film on top of the above-described drain electrodes so that the drain electrodes are multilayered; forming an interlayer capacitor film so as to cover the above-described drain electrodes and source electrodes; and forming common electrodes of a transparent conductive film that has been formed on the above-described interlayer capacitor film.

(14) In the manufacturing method for a display device according to the above (13), in which, in the case where the above-described metal film is wet etched in the step where the above-described drain electrodes are multilayered, wet etching is carried out after an annealing process for crystallizing the transparent conductive film for forming the above-described drain electrodes and source electrodes, while in the case where the above-described metal film is dry etched, no annealing process is carried out.

The present invention can provide a display device using an oxide semiconductor layer where the number of multilayer films and the number of etching steps can be reduced at the time of the manufacture of the display device, and the aperture ratio of the pixels can be increased, as well as a manufacturing method for the same, and thus, it becomes possible to provide a highly reliable display device.

DESCRIPTION OF THE EMBODIMENTS

In the following, the preferred embodiments of the present invention are described in detail.

Figure 1A:
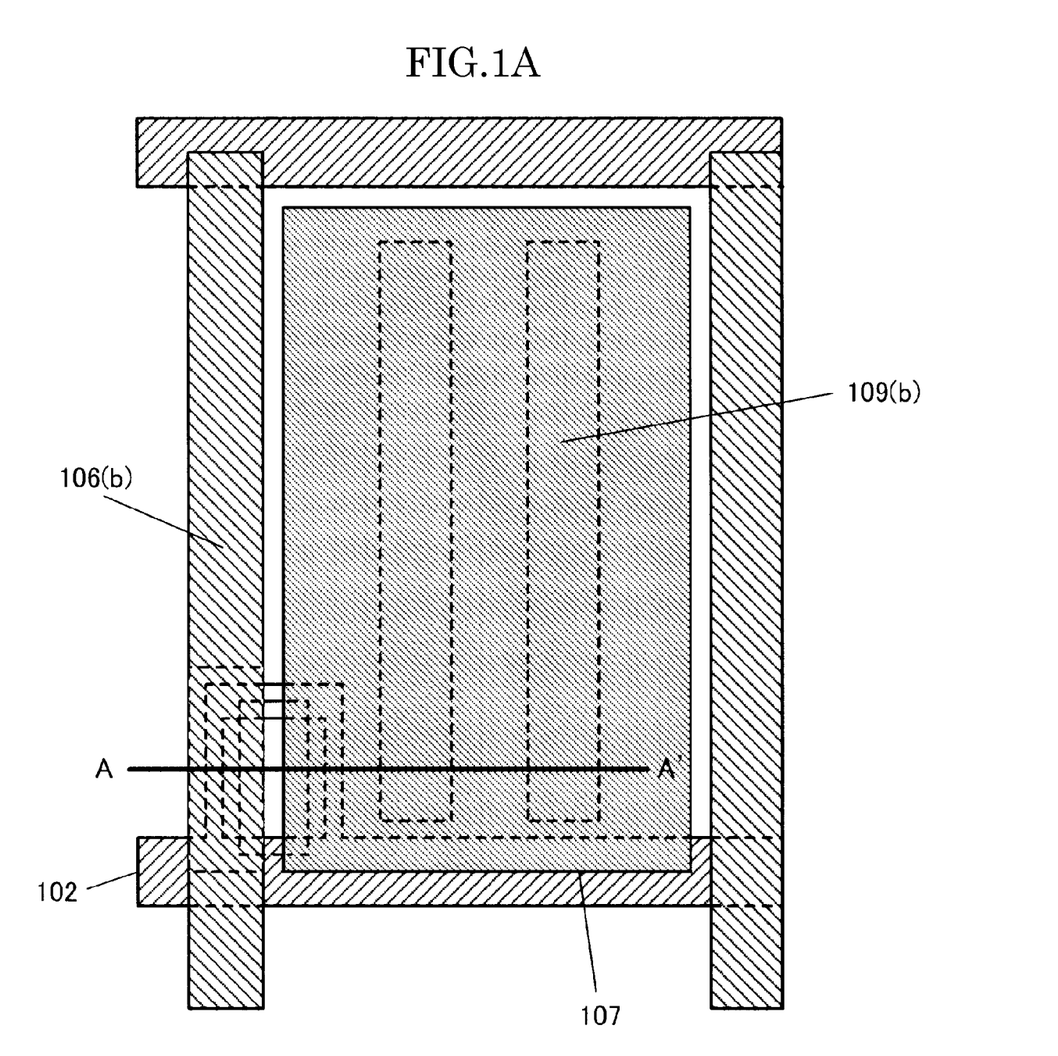
FIGS. 1A and 1B are diagrams for illustrating the display device according to the first embodiment of the present invention.
Figure 1B:
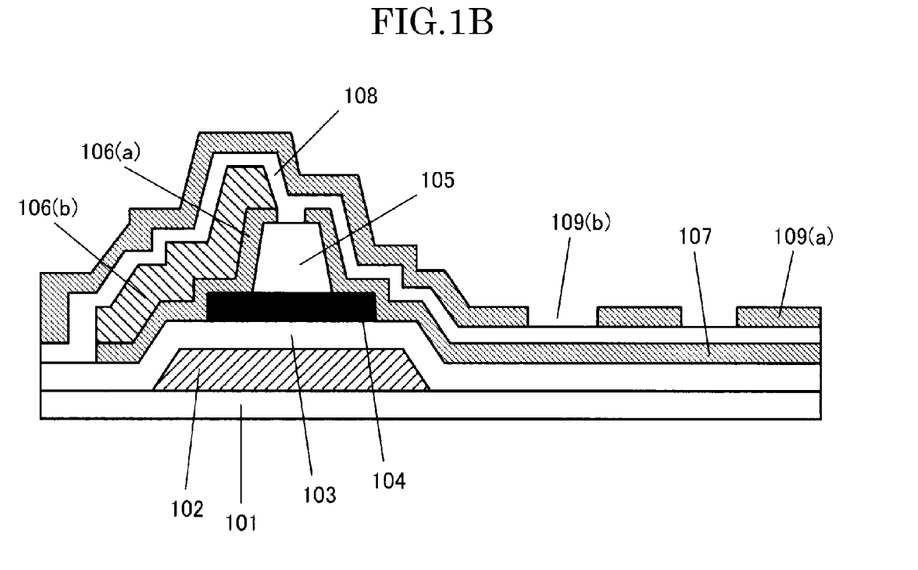

FIGS. 1A and 1B are diagrams for illustrating the display device according to the first embodiment of the present invention, where FIG. 1A is a plan diagram and FIG. 1B is a cross-sectional diagram along A-A' in FIG. 1A.

As shown in FIG. 1B, the display device according to the present invention has: a gate electrode 102 formed on a transparent substrate 101; a gate insulating film 103 that covers the gate electrode 102; an oxide semiconductor 104 formed on top of the gate insulating film 103; a drain electrode 106 and a source electrode 107 formed at a distance from each other with a channel region in the oxide semiconductor 104 in between; an interlayer capacitor film 108 for covering the drain electrode 106 and the source electrode 107; a common electrode 109 formed on top of the interlayer capacitor film 108; and a pixel electrode 107 formed so as to face the common electrode 109 and connected to the above-described source electrode 107, and is characterized in that an etching stopper layer 105 for covering the above-described channel reason is formed between the oxide semiconductor 104 and the drain electrode 106 and source electrode 107, the drain electrode 106 is a multilayer film where a transparent conductive film 106(a) and a metal film 106(b) are layered on top of each other, and the drain electrode 106 and source electrode 107 make direct contact with the oxide semiconductor 104.

The display device according to the present invention is applicable to various types of display devices, such as a liquid crystal display device and an organic EL device, but a case where it is applied to a liquid crystal display device is described as the present embodiment.

FIG. 1A is a plan diagram showing one pixel between a pair of adjacent drain lines 106 and between a pair of adjacent gate lines 102 in the display device according to the present embodiment. Here, the drain lines and the gate lines also work as drain electrodes 106 and gate electrodes 102, respectively.

In the present embodiment, the pixel electrodes are formed of the same transparent conductive film as that for forming the source electrodes 107 so as to be integrated with the source electrodes 107 throughout the entirety in the pixel region. 109(b) are openings in the common electrode.

FIG. 1B is a cross-sectional diagram along A-A' in FIG. 1A. As is clear from FIG. 1B, an oxide semiconductor is used for the channel of the TFTs in the display device according to the present invention, and bottom gate type (reverse staggered type) TFTs where a semiconductor layer and source/drain electrodes are layered on top of a gate electrode in the bottom layer are used in the structure.

Namely, a gate electrode 102 is formed of a metal film that has been formed on a transparent insulating substrate 101 made of glass or the like, and a gate insulating film 103 is formed of an insulating film, such as of SiN, so as to cover the gate electrode 102. In addition, an oxide semiconductor 104, which becomes a channel of the TFT, is formed on top of the gate insulating film 103.

The oxide semiconductor has such properties that carriers move quickly, inconsistencies in the properties are small, and the band gap is large, and thus is appropriate for the display devices, such as a liquid crystal display and an organic EL device. Oxides, such as ZnO, InGaZnO, ZnInO and ZnSnO, can be used as the material for the oxide semiconductor 104.

Though not particularly shown, the display device according to the present embodiment is a so-called backlight type liquid crystal display device, and it is preferable for the oxide semiconductor 104 to be formed so as not to protrude from the gate electrode 102 so that the oxide semiconductor layer 104 is not affected by the backlight.

An etching stopper layer 105 is formed on the oxide semiconductor layer 104 of an insulating film, such as a silicon oxide film, or a multilayer film made of a number of insulators in order to protect the oxide semiconductor layer 104. The etching stopper layer works to prevent the oxide semiconductor 105 from being damaged by the etchant used to form the below-described drain electrode and source electrode through etching.

In addition, the drain electrode 106 and the source electrode 107 are formed so as to make direct contact with the oxide semiconductor layer 104 and are at a distance from each other above the etching stopper layer 105. As described above, the source electrodes 107 are formed throughout the entirety in the pixel region of the display device, preferably of a transparent conductive film, such as of indium tin oxide (ITO) or indium zinc oxide (IZO), in order to work as pixel electrodes.

Meanwhile, it is not necessary for the drain electrodes 106 to be formed of a transparent conductive film, but it is preferable for the drain electrodes 106 to be formed of a transparent conductive film, such as of ITO or IZO, in the same way as the source electrodes 107 at least in the portions that make contact with the oxide semiconductor layer 104 in order to prevent the oxide semiconductor layer 104 from being dissolved, corroded, or damaged by the etchant when the source electrodes 107 are formed through etching in the portions where the drain electrodes 106 cover the oxide semiconductor 104.

However, the drain electrodes 106 also work as drain lines for transmitting a video signal, and therefore, the transmission speed of the video signal that transmits through the drain lines is slow in the case where the drain electrodes 106 are formed of only a transparent conductive film having a high resistance value, which causes a time lag for the display. In order to resolve this time lag, a metal film 106(b) having a resistance value lower than that of the transparent conductive film 106(a) is formed on top of the transparent conductive film 106(a). As a result, the drain electrodes 106 are a multilayer film of the transparent conductive film 106(a) and the metal film 106(b).

The basic structure of the TFT using an oxide semiconductor that is used in the display device according to the present invention is described above, and this structure is the same in the case where various peripheral circuits are formed for a TFT.

An interlayer capacitor film 108 is formed on top of the drain electrode 106 and the source electrode 107 so as to cover them. The interlayer capacitor film 108 is provided so that a video signal can be stored in the pixel electrode 107 for a relatively long period of time after it has been applied to the pixel electrode 107 from a drain line through the TFT and after the TFT has been turned off, and thus is formed of an insulating film, such as of SiN, in the same way as the gate insulating film 103.

A transparent conductive film, such as of ITO, is formed on top of the interlayer capacitor film 108 as a common electrode 109, and thus, a so-called backplane for implementing an in-plane switching (IPS) type liquid crystal display device is complete.

Though in the present embodiment only the structure of a substrate on which TFTs are formed using an oxide semiconductor 105 is described, a substrate facing this substrate and including color filters and a liquid crystal layer between the substrates are also provided, and various types of publicly known structures can be used for them. There are no particular limitations to these structures in the present invention, and therefore, the descriptions thereof are omitted. This is the same for the following embodiments.

In the display device according to the present invention as described above, an etching stopper layer 105 for protecting the oxide semiconductor 104 is formed on top of the oxide semiconductor 104 so that the oxide semiconductor 104 can be prevented from being damaged by an etchant or an external force. After that, the source electrode and pixel electrode 107 (transparent conductive film) as well as the drain electrode 106(b) (metal film) are formed, and thus, the drain electrode 106, which also works as a drain line, can be prevented from being damaged.

Furthermore, the oxide semiconductor 104 is dissolved by the etchant for processing the source/pixel electrode 107 (transparent conductive film), and therefore, the transparent conductive film is patterned for the source/pixel electrode 107 so as to include a portion 106(a) through which the oxide semiconductor 104 and the drain electrode 106 make contact so that the oxide semiconductor 104 can be protected without fail.

Here, the materials and the dimensions of the portions that are not described in the above are described in detail in the following descriptions about the manufacturing method.

FIGS. 2A to 2F illustrate the manufacturing method for a display device according to one embodiment of the present invention. FIGS. 2A to 2F consist of a plan diagram on the left side and a cross-sectional diagram along line A-A' in the plan diagram on the right side.

Figure 2A:
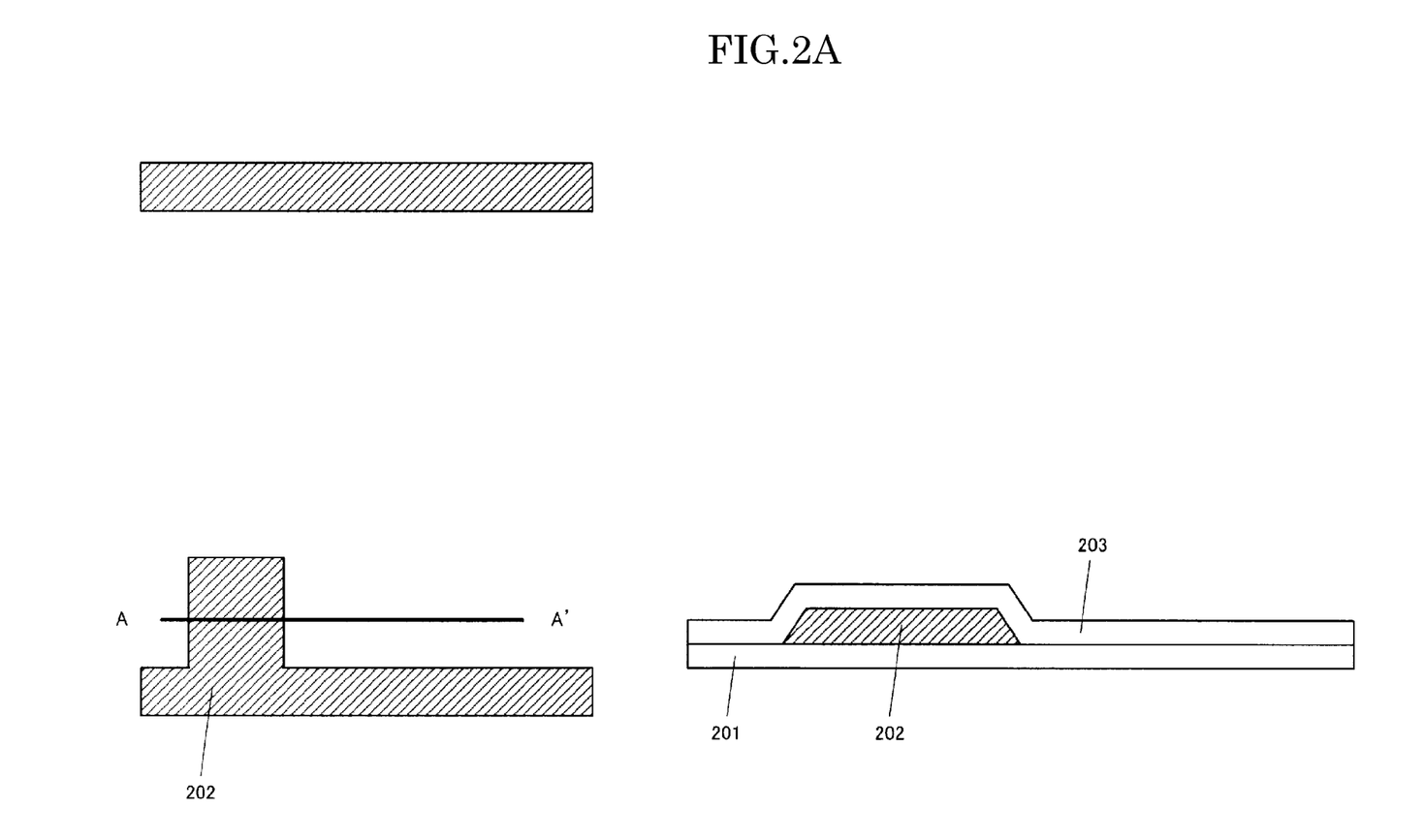
FIG. 2A is a diagram for illustrating the manufacturing method for a display device according to the first embodiment of the present invention.

First, as shown in FIG. 2A, a metal film is formed on top of a transparent insulating substrate 201 made of glass, for example, in accordance with a photolithographic method, and thus, a gate electrode 202 that is integrated with a gate line is formed. The gate electrode 202 is formed of a single film of Mo, Cr, W, Al, Cu, Ti, Ni, Ta, Ag or another metal, a film of an alloy of these metals, or a multilayer film of these, for example.

After that, a gate insulating film 203 is formed so as to cover the gate electrode 202. The gate insulating film 203 is formed of a silicon oxide film, a silicon nitride film, a transparent insulating film of $Al_2O_3$ or the like, or a multilayer film of these. Though the gate insulating film 203 is not shown in the plan diagram in FIG. 2B for the simplicity of the description, this does not mean that the gate insulating film 203 is transparent, and it may be opaque. This is the same for the insulating film in the other embodiments.

Figure 2B:
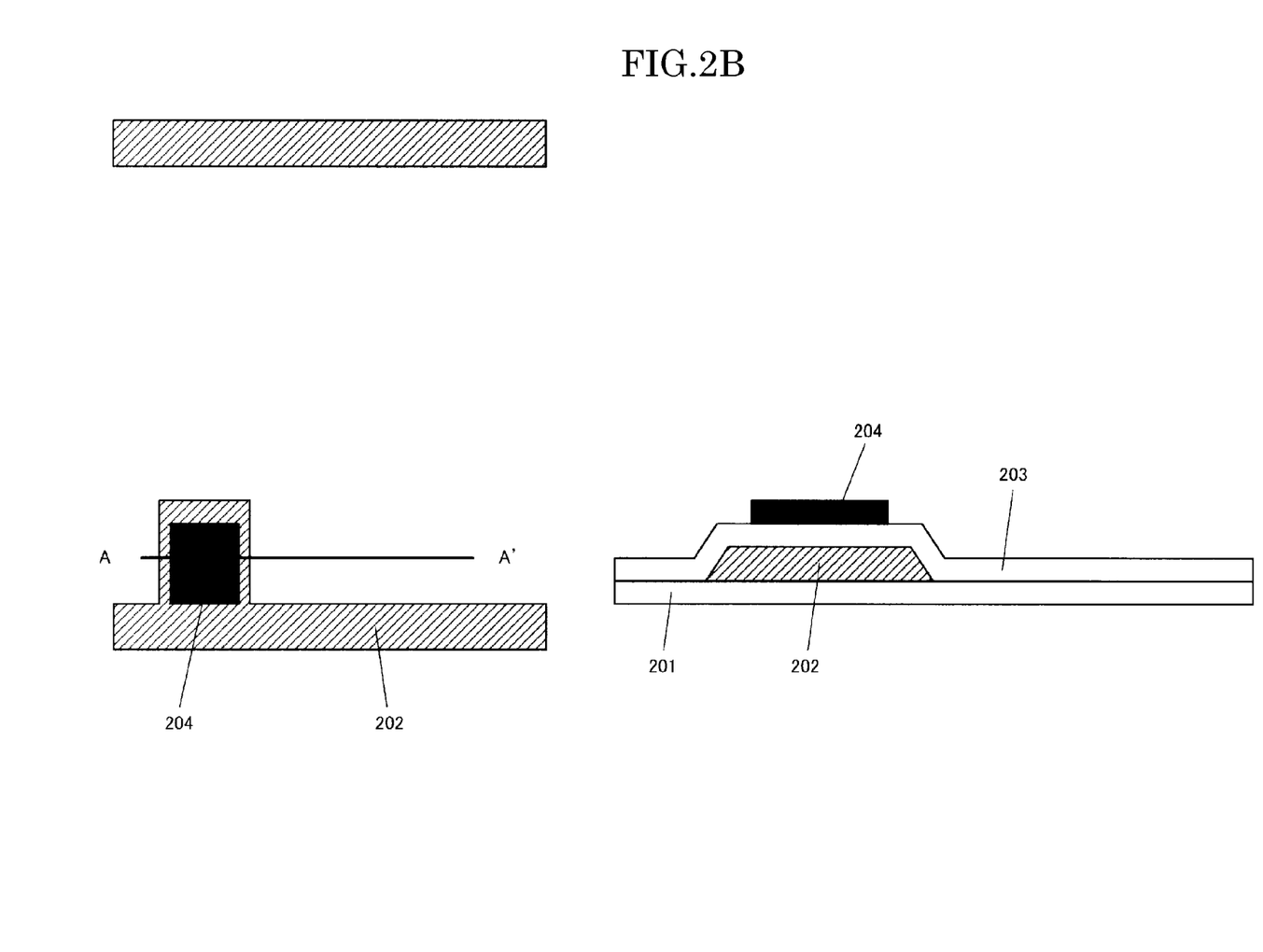
FIG. 2B is a diagram for illustrating the manufacturing method for a display device according to the first embodiment of the present invention.

Next, as shown in FIG. 2B, an oxide semiconductor layer 204 is formed on top of the gate insulating film 203 and is patterned in accordance with a photolithographic method. At this time, the oxide semiconductor layer 204 does not protrude from the gate electrode 202, that is to say, the entirety of the oxide semiconductor layer 204 overlaps the gate electrode 202 as viewed from the top as shown in the plan diagram in FIG. 2B so that the TFT properties can be prevented from deteriorating due to the effect of the backlight in the case of a backlight type liquid crystal display. It is not necessary for the entirety of the oxide semiconductor layer 204 to overlap the gate electrode 202 in the case of an organic EL display or a reflection type liquid crystal display which do not require a backlight.

Figure 2C:
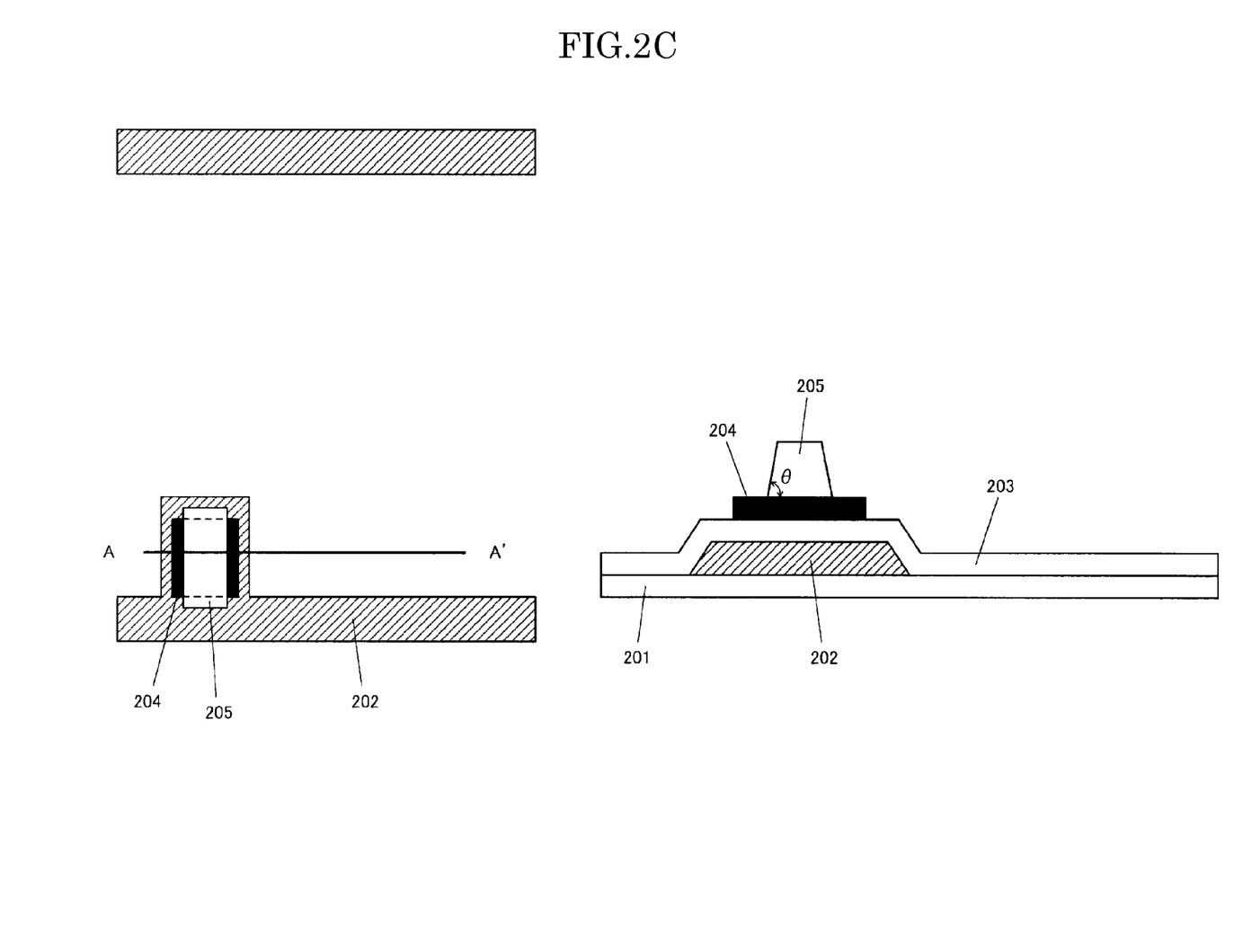
FIG. 2C is a diagram for illustrating the manufacturing method for a display device according to the first embodiment of the present invention.

There is a risk of this oxide semiconductor layer 204 being dissolved in the etchant that is used when the below-described drain electrode and source electrode are formed through etching. Therefore, as shown in FIG. 2C, a silicon oxide film, a silicon nitride film, an insulating film of $Al_2O_3$ or the like, or a multilayer film of these are formed so as to cover the channel region in the oxide semiconductor layer 204 and then processed so that an etching stopper layer 205 is formed.

Here, the channel region in the oxide semiconductor layer 204 is a region in the semiconductor layer of the TFT through which carriers (electrons or holes) flow from the source electrode to the drain electrode or vice versa while being controlled by the gate electrode. Covering the channel regions means that the etching stopper layer 205 covers a predetermined portion of the oxide semiconductor layer 204 including the center portion to such an extent as shown in the plan diagram in FIG. 2C.

As for the height of the etching stopper layer 205, the possibility of the oxide semiconductor layer 204 making contact with the etchant, and thus being damaged, is high when the etching stopper layer 205 is too low. Conversely, when it is too high, the thickness of the display device increases, and in addition, the risk of the etchant entering into a local crack in the transparent conductive film layer, which becomes a drain electrode and a source electrode, is high because such a crack easily occurs to the transparent conductive film layer that covers the oxide semiconductor layer. Accordingly, it is preferable for the height of the etching stopping layer 205 to be approximately 50 nm to 500 nm.

Furthermore, it is preferable for the etching stopper layer 205 to be tapered in a cross-section at an angle of 10 degrees to 75 degrees in order to prevent the transparent conductive film layer from disconnecting in the portion that makes contact with the below-described transparent conductive film layer 206(a), 207. Here, the angle at which the etching stopper layer 205 is tapered is θ in FIG. 2C.

Figure 2D:
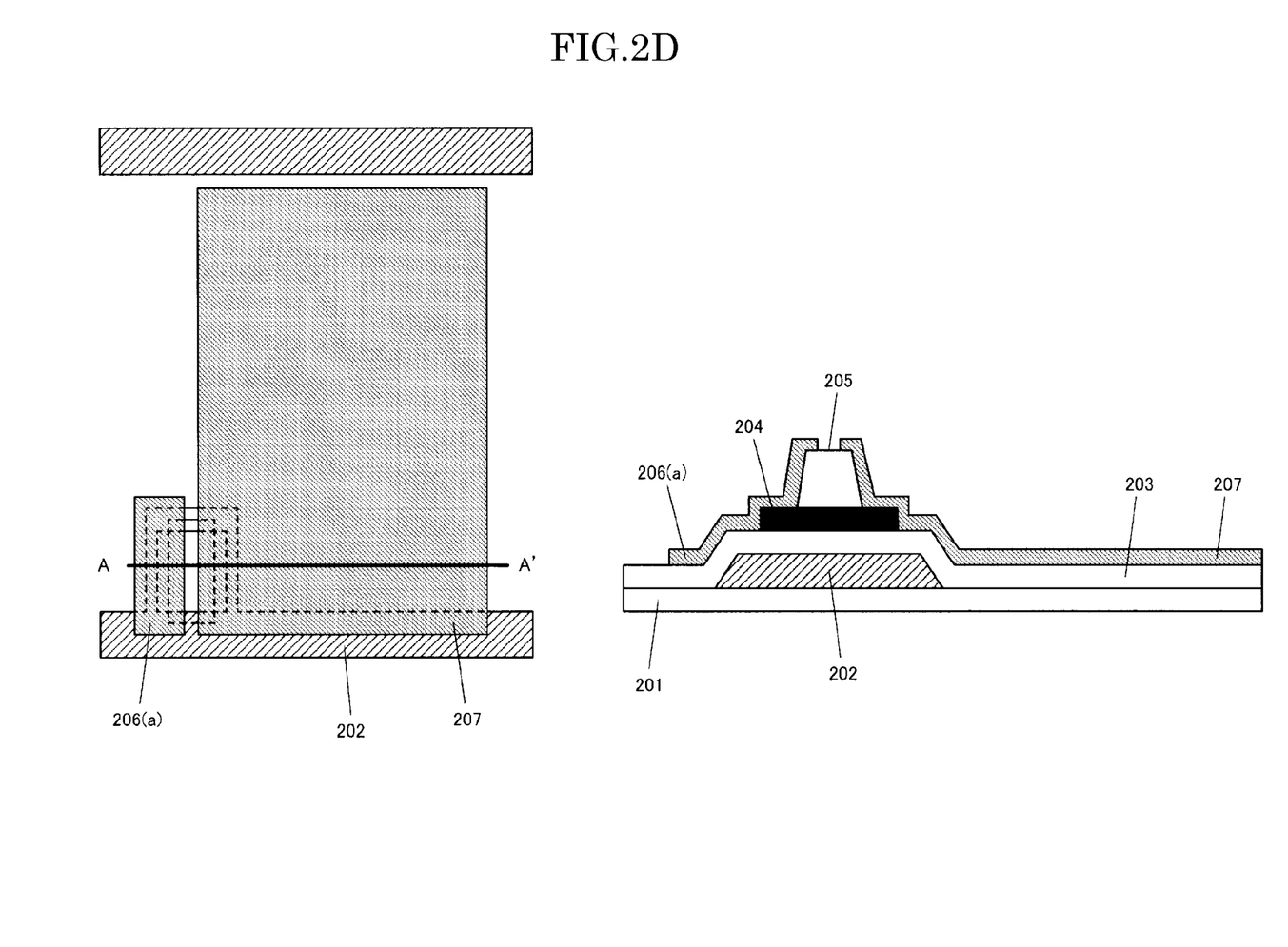
FIG. 2D is a diagram for illustrating the manufacturing method for a display device according to the first embodiment of the present invention.

Next, as shown in FIG. 2D, a transparent conductive film of ITO, IZO or the like is formed and processed so as to form a drain electrode 206(a) and a source electrode 207 which are at a distance from each other above the etching stopper layer 205. At this time, as shown in the plan diagram in FIG. 2D, the transparent conductive film for the source electrode 207 is processed so as to cover the entirety of a pixel region and function as a pixel electrode. The transparent conductive film is formed in an amorphous state in accordance with a vapor deposition method, such as a vacuum vapor deposition method.

At this time, it is preferable for the film thickness of the transparent conductive film layer 206(a) for the source electrode 207 and the drain electrode to be approximately 10 nm to 100 nm, taking into consideration the balance between the reduction in the thickness of the display device and the protective function.

After that, it is necessary to form a metal film 206(b) on top of the drain electrode 206(a) in order to allow a data signal to transfer without a time lag as described above. In the case where this metal film 206(b) is formed through wet etching using an etchant, it is necessary to carry out an annealing process at approximately 150° C. to 400° C. in order to convert the transparent conductive film 206(a) and 207 in the amorphous state to a crystal state. This is because the transparent conductive film in the amorphous state is dissolved by the etchant. In the case where the metal film 206(b) for the drain electrode is formed through dry etching using plasma or a gas, an annealing process for crystallization is not necessary.

Figure 2E:
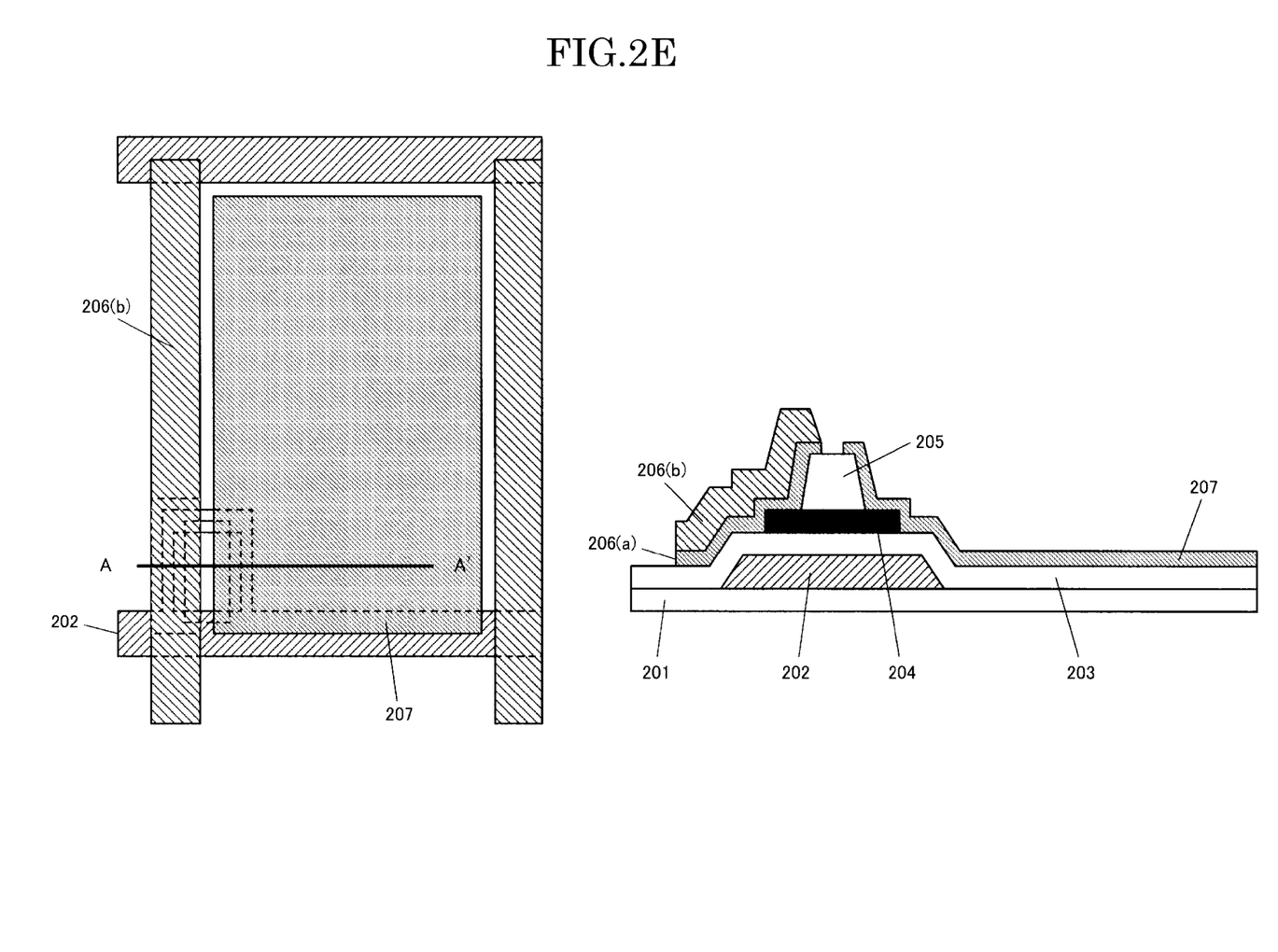
FIG. 2E is a diagram for illustrating the manufacturing method for a display device according to the first embodiment of the present invention.

After the above-described process, as shown in FIG. 2E, the metal film 206(b) for transmitting a data signal is formed and processed so as to cover the transparent conductive film 206(a) on the drain electrode side. As a result, the video signal that transmits through the drain line is supplied to the pixel electrode without a time lag, and thus, the displaying performance is not decreased.

The metal film 206(b) for the drain electrode has a resistance value lower than that of the transparent conductive film 206(a), and thus may be formed of a single film of Mo, Cr, W, Al, Cu, Ti, Ni, Ta, Ag or another metal, a film of an alloy of these metals, or a multilayer film of these in the same way as the gate electrode 202, for example.

Though in the cross-section in FIG. 2E the transparent conductive film 206(a) in the layer with the drain electrode and the metal film 206(b) are patterned to have the same dimensions, they may have different dimensions due to the error in the alignment in photolithography or the scaling down in the dimensions during processing.

Figure 2F:
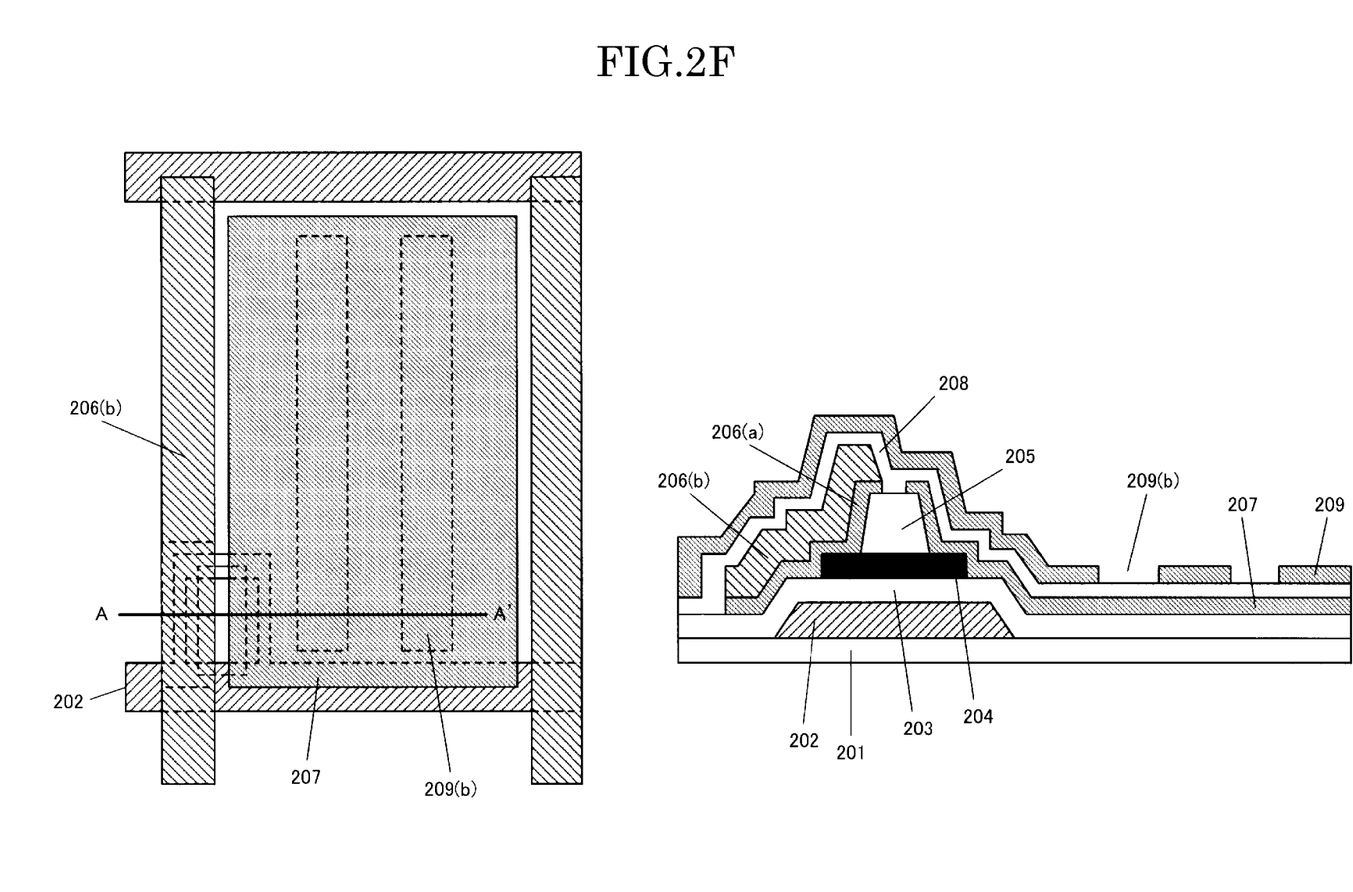
FIG. 2F is a diagram for illustrating the manufacturing method for a display device according to the first embodiment of the present invention.

Then, as shown in FIG. 2F, a silicon oxide film, a silicon nitride film, an insulating film of $Al_2O_3$ or the like, or a multilayer film of these is formed as an interlayer capacitor film 208 in which through holes are created, and after that, a transparent conductive film is formed and processed so that a common electrode 209 is formed, and thus, the backplane of the IPS liquid crystal display according to the first embodiment of the present invention is complete.

By adopting the above-described manufacturing method, the number of films that are layered and the number of etching steps can be reduced so that the thickness of the display device and the cost can be reduced. Furthermore, the oxide semiconductor 204 is protected by the etching stopper layer 205 and the transparent conductive film 206(a) of the drain electrode, and therefore, disconnection can be prevented from occurring, and thus, the display performance can be prevented from decreasing. In addition, the pixel electrode (source electrode) is made to make direct contact with the oxide semiconductor, and as a result, it is possible to form a pixel having a high aperture ratio.

Figure 3:
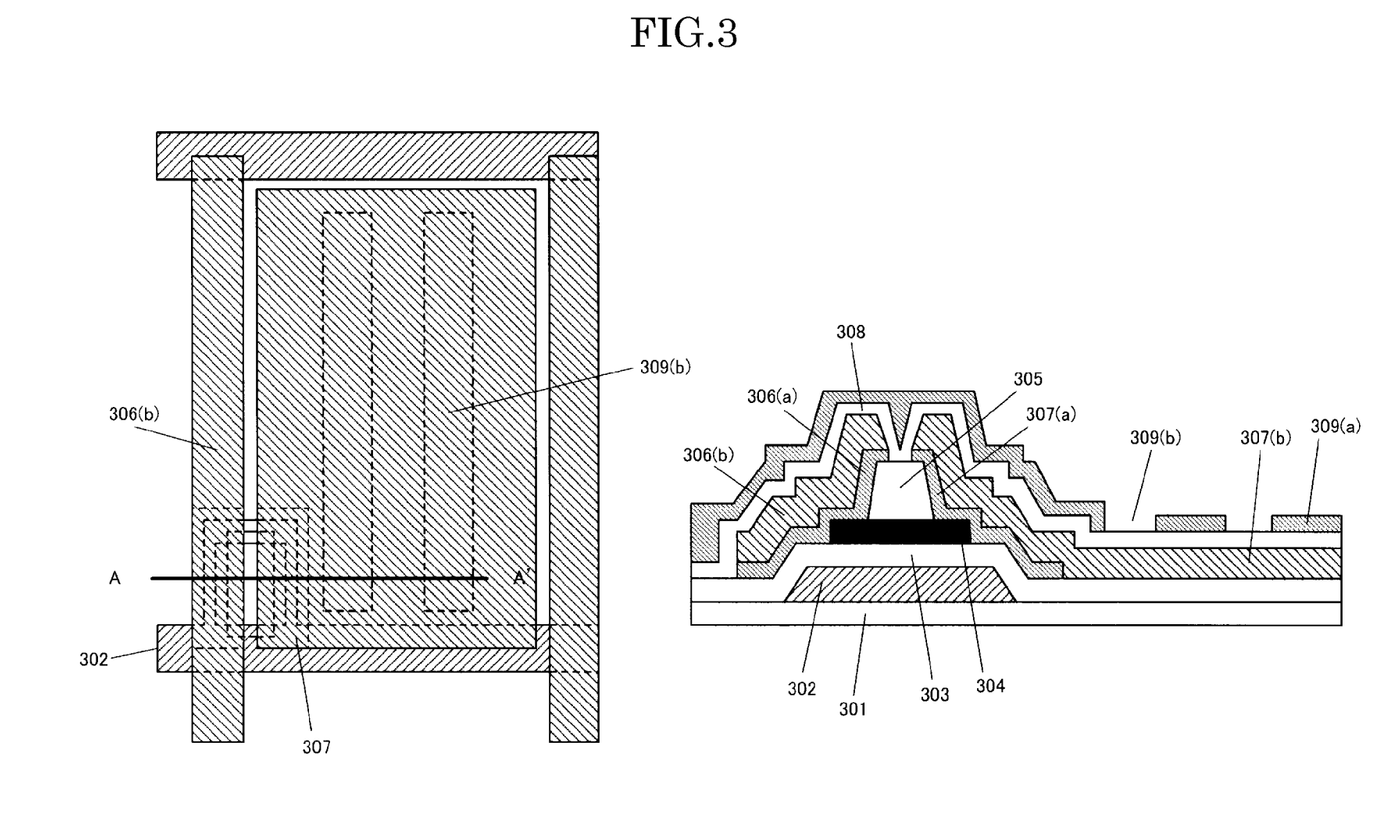
FIG. 3 is a diagram for illustrating the display device according to the second embodiment of the present invention.

FIG. 3 shows the display device according to the second embodiment of the present invention. This is different from the first embodiment in FIG. 1 in that the source electrode 307 has a multilayer structure of a transparent conductive film 307(a) and a metal layer 307(b), and the pixel electrode portion, which consists of only the transparent conductive film 107 in the first embodiment, consists of only a metal layer 307(b).

In the case where the structure as in FIG. 3 is adopted, 307(b) in the pixel electrode portion has reflectivity, and therefore, the display device according to the present embodiment has reflective type pixels. In this case, front light type is appropriate for the light source, and as a result, a display having high visibility outdoors can be implemented.

Figure 4:
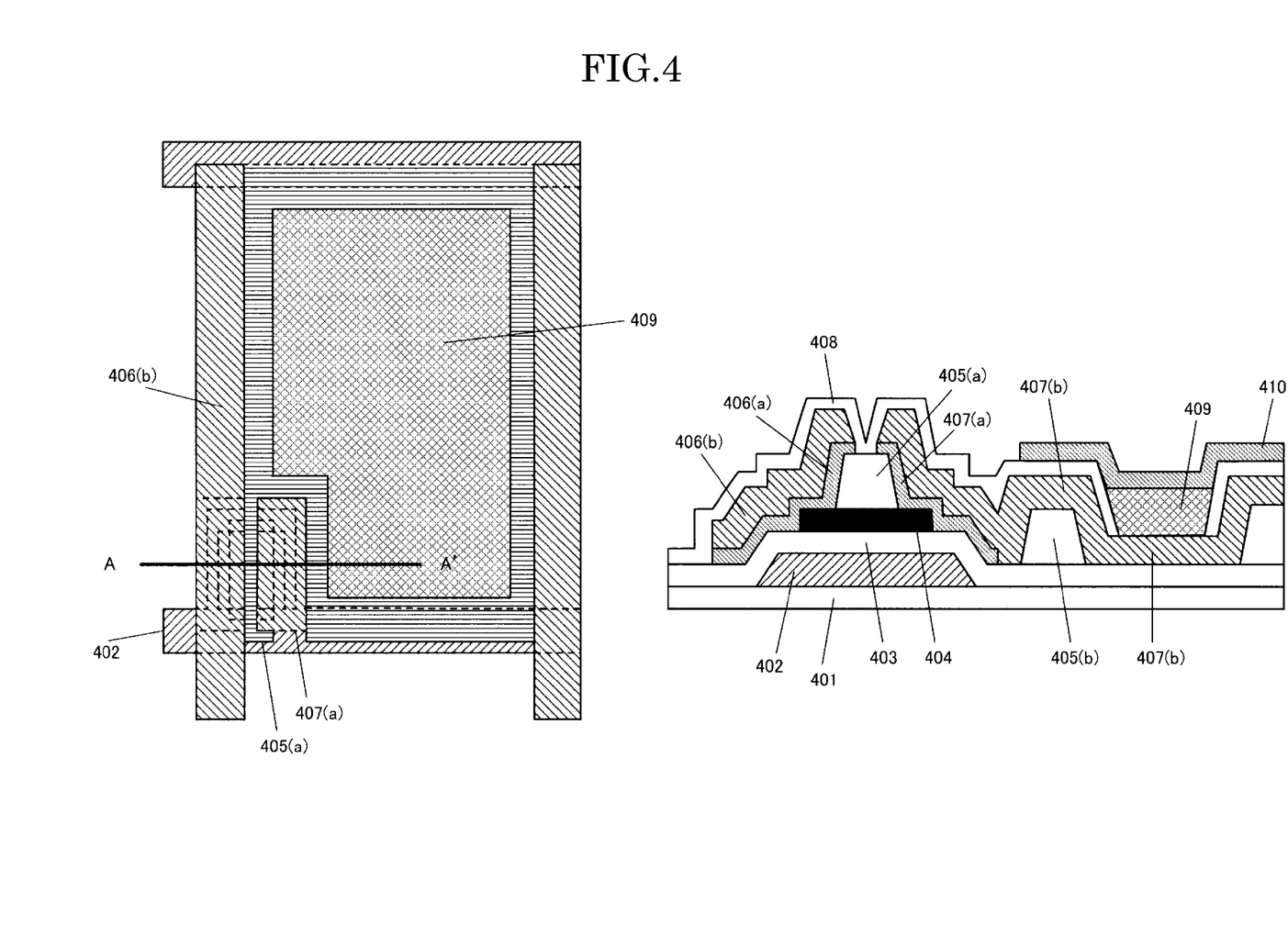
FIG. 4 is a diagram for illustrating the display device according to the third embodiment of the present invention.

FIG. 4 shows an embodiment in the case where the display device according to the present invention is applied to an organic EL display. Though the display device according to the present embodiment has the same structure in the TFT portion including the oxide semiconductor as the liquid crystal display device according to the first and second embodiments in FIGS. 1 and 3, the display device according to the present embodiment is characterized by being an organic EL display device having a top emission structure where the metal film 407(b), which is used as the reflective electrode in the second embodiment, is used as a lower electrode, and in addition, along with an upper electrode 410 formed of a transparent conductive film, sandwiches an organic EL element 409.

Furthermore, though not shown, the transparent conductive film 407(a) for the source electrode can be integrally formed throughout the entirety of the pixel region in the same manner as in the first embodiment so as to function as a lower electrode 407(b), and along with the upper electrode 410 formed of a metal film, sandwiches an organic EL element 409 so as to provide a bottom emission structure.

The present invention can be applied to an organic EL display device as described above, and thus, the organic EL device, which is already thin because no backlight is necessary, can be further made thinner.

Though the embodiments of the present invention are described above in reference to the drawings, the present invention is not limited to the above-described embodiments, and various modifications in the design are possible as long as the gist of the present invention is not deviated from.

The present invention can provide a display device using an oxide semiconductor layer where the number of multilayer films and the number of etching steps can be reduced at the time of the manufacture of the display device, and the aperture ratio of the pixels can be increased, as well as a manufacturing method for the same, and thus, it becomes possible to provide a highly reliable display device.

What is claimed is:

1. A liquid crystal display device, comprising: gate electrodes formed on a transparent substrate; a gate insulating film for covering said gate electrodes; an oxide semiconductor formed on said gate insulating film; drain electrodes and source electrodes formed at a distance from each other with channel regions in said oxide semiconductor in between; an interlayer capacitor film formed of an insulating film for covering said drain electrodes and source electrodes; common electrodes formed on top of said interlayer capacitor film; and pixel electrodes formed so as to face said common electrodes and connected to said source electrodes, wherein
  a side of said pixel electrodes opposing said common electrodes is in contact only with said interlayer capacitor film,
  an etching stopper layer for covering said channel regions is formed between said oxide semiconductor and said drain electrodes and source electrodes,
  said drain electrodes are comprised of a multilayer film including a transparent conductive film and a metal film layered on top of each other,
  said drain electrodes and source electrodes make direct contact with said oxide semiconductor,
  the entirety of said oxide semiconductor overlaps said gate electrode as viewed from the top, and said source electrodes and said pixel electrodes are integrally formed of the same transparent conductive film, and
  said etching stopper layer is tapered in the vertical direction in a cross-section at an angle of 10 degrees or greater and 75 degrees or less to prevent disconnection of the etching stopper layer at points of contact between the etching stopper layer and the source and drain electrodes.

2. The liquid crystal display device according to claim 1, wherein
  said source electrodes are comprised of a multilayer film including a transparent conductive film and a metal film layered on top of each other,
  said pixel electrodes are formed of said metal film for forming said source electrodes, and
  said source electrodes and said pixel electrodes are continuously formed.

3. The liquid crystal display device according to claim 1, wherein
  the thickness of said transparent conductive film for forming said source electrodes and drain electrodes is 10 nm or greater and 100 nm or less.

4. The liquid crystal display device according to claim 1, wherein the height of said etching stopping layer is 50 nm or greater and 500 nm or less.

5. The liquid crystal display device according to claim 1, wherein said oxide semiconductor includes at least one of ZnO, InGaZnO, ZnInO and ZnSnO.

6. The liquid crystal display device according to claim 1, wherein said transparent conductive film is formed of either indium tin oxide or indium zinc oxide.

7. The liquid crystal display device according to claim 1, wherein said metal film includes one of Mo, Cr, W, Al, Cu, Ti, Ni, Ta and Ag.

* * * * *